(12) United States Patent
Hashimoto

(10) Patent No.: US 7,642,795 B2
(45) Date of Patent: Jan. 5, 2010

(54) DRIVE METHOD AND DRIVE CIRCUIT OF PELTIER ELEMENT, ATTACHING STRUCTURE OF PELTIER MODULE AND ELECTRONIC DEVICE HANDLING APPARATUS

(75) Inventor: Takashi Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 47 days.

(21) Appl. No.: 11/793,616

(22) PCT Filed: Dec. 21, 2004

(86) PCT No.: PCT/JP2004/019114

§ 371 (c)(1),
(2), (4) Date: Aug. 28, 2007

(87) PCT Pub. No.: WO2006/067838

PCT Pub. Date: Jun. 29, 2006

(65) Prior Publication Data

US 2008/0106293 A1    May 8, 2008

(51) Int. Cl.
*G01R 31/02* (2006.01)
(52) U.S. Cl. .................................. 324/760; 324/158.1
(58) Field of Classification Search .................. None
See application file for complete search history.

(56) References Cited

U.S. PATENT DOCUMENTS 7,082,772 B2 *  8/2006  Welch ........................... 62/3.2

2002/0062854 A1 *  5/2002  Sharp ........................... 136/203

FOREIGN PATENT DOCUMENTS

| JP | A-5-241668 | 9/1993 |
| JP | A-7-295659 | 11/1995 |
| JP | A-11-289111 | 10/1999 |
| JP | 2000-187060 | * 4/2000 |
| JP | A-2000-187060 | 7/2000 |
| JP | A-2000-324692 | 11/2000 |
| JP | A-2002-151749 | 5/2002 |
| JP | A-2002-280430 | 9/2002 |

OTHER PUBLICATIONS

PCT International Search Report mailed on Apr. 12, 2005 for the corresponding International patent application No. PCT/JP2004/019114 (copy enclosed).

* cited by examiner

*Primary Examiner*—Vinh P Nguyen
(74) *Attorney, Agent, or Firm*—Posz Law Group, PLC

(57) ABSTRACT

By limiting a current change rate of a power to be supplied to a peltier element by using a pulse width control means for controlling to increase/decrease a pulse width of a pulse signal so that a temperature change of the peltier element does not exceed a predetermined temperature gradient and a switching means for controlling to turn on/off a drive current to be supplied to the peltier element based on a pulse signal having a pulse width controlled by the pulse width control means, an abrupt change of a rate of expansion and a rate of shrinkage of respective parts of the peltier element are suppressed and a stress imposed to the peltier element can be reduced, consequently, a lifetime of the peltier element can be maintained long.

9 Claims, 7 Drawing Sheets

DRIVE METHOD AND DRIVE CIRCUIT OF PELTIER ELEMENT, ATTACHING STRUCTURE OF PELTIER MODULE AND ELECTRONIC DEVICE HANDLING APPARATUS

TECHNICAL FIELD

The present invention relates to a drive method and a drive circuit of a peltier element, an attaching structure of a peltier module and an electronic device handling apparatus provided with a pusher having a peltier module.

BACKGROUND ART

Driving of a peltier element as a cooling/heating element is normally controlled by turning on/off a direct-current power source. However, when controlling the driving by turning on/off the direct-current power source, a current flows to the peltier element at once, so that a temperature of the peltier element abruptly changes and a temperature stress is imposed on element components. A temperature difference between one surface (cooling surface) and the other surface (heat release surface) of the peltier element becomes, for example, 50° C. or higher, therefore, a temperature stress due to an abrupt temperature change easily causes a deterioration of the element, so that there has been a disadvantage that a lifetime of the peltier element becomes short.

To elongate the lifetime of the peltier element, it is considered to flow a current having an analog mild gradient by using a variable power source, however, such a variable power source device is expensive and disadvantageous in terms of costs.

A peltier element comprises a P-type thermoelectric element and an N-type thermoelectric element. The thermoelectric elements are electrically connected in series and sandwiched between a pair of substrates, so that a peltier module is formed. Such a peltier module is, for example, attached to a pusher provided in a handler of an electronic device testing apparatus for testing an IC device, etc. and used for controlling the IC device to be tested to be a desired temperature via the pusher.

In that case, a generally used structure is that the peltier module is bonded by pressure to an upper surface of the pusher via silicone grease, etc., a heat sink, etc. is bonded by pressure on an upper surface of the peltier module via silicone grease, etc. and the heat sink, etc. is fixed to the pusher by using a separate member.

DISCLOSURE OF THE INVENTION

Problem to be Solved by the Invention

However, in the attaching structure of a peltier module as explained above, a peltier element sandwiched between substrates of the peltier module is constantly applied with a very high pressure. When an excessive pressure is constantly applied to the peltier element as such, it is considered that resistance to a thermal stress due to cooling and heating declines and a lifetime of the peltier element becomes short.

An object of the present invention is to provide a drive method and a drive circuit of a peltier element capable of maintaining a lifetime of the peltier element long, an attaching structure of a peltier module and an electronic device handling apparatus provided with a pusher having a peltier module.

Means for Solving the Problem

To attain the above object, firstly, the present invention provides a drive method of a peltier element, wherein a drive current to be supplied to the peltier element is controlled to be turned on/off and supplied as a pulse, and a pulse width of the drive current is controlled to be increased/decreased so that a temperature change of the peltier element does not exceed a predetermined temperature gradient (invention 1).

When a current change rate of a current supplied to the peltier element is too high, an uneven heat distribution arises inside the peltier element and unevenness of a rate of expansion and a rate of shrinkage of respective parts of the peltier element generated thereby leads to a mechanical stress. However, according to the above invention (the invention 1), by controlling to increase/decrease a pulse width so that a temperature change of the peltier element does not excess a predetermined temperature gradient, the current change rate can be limited. As a result that an abrupt change of a rate of expansion and a rate of shrinkage of the peltier element can be suppressed thereby, a mechanical stress to be imposed on the peltier element can be reduced and a lifetime of the peltier element can be maintained long. Also, when embodying the above invention (the invention 1), an expensive variable power source is not necessary and an inexpensive direct-current power source and a general circuit, etc. available on the market may be used to compose the drive circuit.

In the above invention (the invention 1), preferably, cycle time of the pulse is controlled for each predetermined cycle so as to be sufficiently shorter than a thermal time constant of the peltier element (invention 2). When a current is supplied to the peltier element at once, a temperature of the peltier element abruptly changes to impose a thermal stress on components thereof, however, by switching to turn on/off by shortening a cycle time of a pulse as in the above invention (the invention 2), an abrupt temperature change (thermal stress) hardly arises on the peltier element and an advantage of not adversely affecting a lifetime of the peltier element can be obtained.

In the above inventions (the inventions 1 and 2), a pulse width of the drive current may be controlled based on a predetermined control signal (invention 3). As the predetermined control signal, for example, a temperature signal, etc. from a temperature detection means for detecting a temperature of an object to be cooled/heated by the peltier element may be mentioned. According to the invention, a temperature of the object to be cooled/heated can be surely controlled.

Secondly, the present invention provides a drive circuit of a peltier element, comprising a pulse width control means for controlling to increase/decrease a pulse width of a pulse signal so that a temperature change of the peltier element does not exceed a predetermined temperature gradient, and a switching means for controlling to turn on/off a drive current to be supplied to the peltier element based on the pulse signal having a pulse width controlled by the pulse width control means (invention 4).

In the above invention (the invention 4), preferably, the pulse width control means controls a cycle time of the pulse signal for each predetermined cycle so as to be sufficiently shorter than a thermal time constant of the peltier element (invention 5).

In the above invention (the invention 4), the pulse width control means controls the pulse width of the pulse signal based on a control signal from the outside (invention 6).

In the above invention (the invention 4), a temperature detection means for detecting a temperature of an object to be cooled/heated by the peltier element is furthermore provided;

wherein the peltier element may be controlled based on a temperature signal from the temperature detection means so that a temperature of the object to be cooled/heated becomes a predetermined temperature (invention 7).

In the above invention (the invention 7), the object to be cooled/heated is an electronic device to be tested as a subject of an electric test, and the temperature detection means applies a temperature-dependent property of a diode provided to the electronic device to be tested itself to detection of a temperature of the electronic device to be tested (invention 8). According to the invention (the invention 8), a temperature of a junction of an electronic device to be tested can be directly detected, so that an excellent temperature control can be made.

Thirdly, the present invention provides an attaching structure of a peltier module for attaching the peltier module to an object to be cooled/heated, wherein the peltier module is attached to the object to be cooled/heated so that an excessive pressure is not constantly applied to the peltier module (invention 9). Note that the "excessive pressure" mentioned here means a pressure applied to the peltier module to a degree of generating an excessive stress imposed on the peltier element along with a thermal expansion of the peltier module when the peltier module is fixed.

When an excessive pressure is constantly applied to the peltier element, it is considered that resistance to a thermal stress due to cooling and heating declines and a lifetime of the peltier element becomes short. However, according to the above invention (the invention 9), an excessive pressure is not constantly applied to the peltier element, so that a thermal stress imposed on the peltier element due to cooling and heating is a little and a lifetime of the peltier element can be maintained long.

In the above invention (the invention 9), the object to be cooled/heated may be a pusher capable of pressing an electronic device to be tested against a contact portion of a test head for conducting a test on the electronic device and, in that case, the peltier module may be attached to an opposite side of the side for pressing the electronic device to be tested of the pusher (invention 10).

In the above invention (the invention 10), preferably, the peltier module comprises a substrate capable of composing a cooling surface and a substrate capable of composing a heat release surface, and the peltier module is attached to the pusher so that the cooling surface positions on an opposite side of the side of pressing the electronic device to be tested of the pusher (invention 11).

In the above invention (the invention 11), the peltier module may be attached to the pusher as a result that a substrate capable of composing the cooling surface is fixed to the pusher (an invention 12). Note that by changing a direction of a current flowing in the peltier module, the cooling surface can become a heat release surface. According to the invention (the invention 12), even when a substrate of the peltier module expands by being heated, since the substrate capable of composing a heat release surface is movable, almost no stress is generated on the peltier element and a mechanical stress to be imposed on the peltier element is small, therefore, a lifetime of the peltier element can become long.

In the above invention (the invention 11), the peltier module may be attached to the pusher in a state of being elastically pressed against the pusher (invention 13). According to the invention (the invention 13), even when a substrate of the peltier module expands by being heated, since the peltier module is capable of moving away from a pusher, almost no stress is generated on the peltier element and a mechanical stress to be imposed on the peltier element is small, therefore, a lifetime of the peltier element can become long.

In the above invention (the invention 11), preferably, a heat release surface of the peltier module is provided with a heat release means capable of accelerating heat release from the heat release surface (invention 14). According to the invention (the invention 14), a cooling efficiency by the peltier module can be improved.

In the above invention (the invention 14), the heat release means may be a peltier module heat radiator capable of releasing heat from the heat release surface of the peltier module via a temperature adjusting medium (invention 15).

In the above invention (the invention 15), the peltier module heat radiator may comprise a cover member for covering the heat release surface of the peltier module and a temperature adjusting medium supply portion for introducing a temperature adjusting medium into the cover member (invention 16). According to the invention (the invention 16), a weight imposed on the peltier module can be made light.

In the above invention (the invention 10), preferably, the pusher is movable in a direction of pressing an electronic device to be tested against a contact portion of a test head and a direction of separating from the contact portion of the test head (invention 17). Also preferably, in the above invention (the invention 10), the pusher is provided with guide pins for guiding the pusher to align with socket guides provided to the contact portion of the test head (invention 18).

Fourthly, the present invention provides an electronic device handling apparatus for bringing electric terminals of an electronic device to be tested electrically contact with a contact portion of a test head by pressing, comprising a pusher having a peltier module attached by the above attaching structure of a peltier module (the inventions 9 to 18) (invention 19).

In the above invention (the invention 19), preferably, the above drive circuit (the inventions 4 to 8) is connected to the peltier module attached to the pusher (invention 20). According to the invention (the invention 20), a lifetime of the peltier element can be maintained long in terms of both of a structure and control thereof.

ADVANTAGEOUS EFFECT OF THE INVENTION

According to the present invention, a lifetime of a peltier element can be maintained long.

DESCRIPTION OF THE PREFERRED EMBODIMENT

Below, embodiments of the present invention will be explained based on the drawings.

[Drive Circuit of Peltier Element]

FIG. 1 is a view of the configuration of a drive circuit of a peltier element according to an embodiment of the present invention, and FIG. 2 is a graph showing a temperature change of a peltier element with respect to a pulse voltage supplied to the peltier element by the drive circuit of the peltier element according to the same embodiment.

A drive circuit of the peltier element according to the present embodiment comprises a PWM cycle generation circuit C1, a sawtooth wave generation circuit C2 connected to the PWM cycle generation circuit C1, a current change rate generation circuit C3, a reference voltage conversion circuit C4 connected to the current change rate generation circuit C3, a voltage comparator C5 connected to the sawtooth wave generation circuit C2 and the reference voltage conversion circuit C4, a transistor switch C6 connected to the voltage comparator C5 and the peltier module 300 and a direct-current power source (not shown in the figures). Note that the peltier module 300 includes a plurality of peltier elements each composed of a pair of P-type thermoelectric element and N-type thermoelectric element.

In the above configuration, the PWM cycle generation circuit C1, the sawtooth wave generation circuit C2, the current change rate generation circuit C3, the reference voltage conversion circuit C4 and the voltage comparator C5 correspond to the pulse width control means of the present invention, and the transistor switch C6 corresponds to the switching means of the present invention.

The PWM cycle generation circuit C1 is a circuit for generating a pulse signal having a constant cycle ($W_t$) from a reference clock input to the PWM cycle generation circuit C1 and may be composed, for example, of a programmable divider. The programmable divider generates a pulse signal having a constant cycle obtained by receiving a reference clock and dividing to a desired frequency division value.

The above pulse cycle ($W_t$) is preferably a sufficiently shorter cyclic time than a thermal time constant of a peltier element used in the peltier module 300, for example, a frequency of preferably 10 kHz or higher in terms of a frequency ($1/W_t$), and the transistor switch C6 is switched on/off at the frequency. By switching on/off a current supplied to the peltier element at such a high frequency, an abrupt temperature change (thermal stress) is not generated on the peltier element, so that an advantage of not adversely affecting a lifetime of the peltier element can be obtained.

The sawtooth wave generation circuit C2 is a circuit for repeatedly generating a sawtooth wave signal changing in a sawtooth wave shape over time based on the pulse signal input from the PWM cycle generation circuit C1. The sawtooth wave signal generated in the sawtooth wave generation circuit C2 is output to a "+" side of the voltage comparator C5.

On the other hand, the current change rate generation circuit C3 is a circuit for receiving a control signal from the outside and generating a change rate signal for limiting an average current change rate to be in a range of zero to ± maximum current change rate. The generated change rate signal is output to the reference voltage conversion circuit C4. The maximum current change rate is a maximum permissive current change rate in a range where a desired lifetime of the peltier element can be maintained.

When a value of the change rate signal output from the current change rate generation circuit C3 is zero, a power supplied to the peltier element is maintained to be in the state immediately before that. When the value of the change rate signal is a "+" value (a positive value), a power supplied to the peltier element increases at an increase rate corresponding to the positive value, while when the value is a "−" value (a negative value), power supplied to the peltier element decreases at a decrease rate corresponding to the negative value.

Note that the current change rate generation circuit C3 has a limiting effect (a limiter) of limiting a change rate of the change rate signal to be output to be the maximum current change rate or lower even when a control signal under a condition of exceeding the maximum current change rate is input from the outside.

Here, a value of the maximum current change rate is regulated so that a temperature gradient of the peltier element becomes to be in a range of maintaining a lifetime of the peltier element. For example, a predetermined maximum current change rate value may be regulated in accordance with a kind of the peltier element, alternately, a predetermined maximum current change rate value may be regulated based on a temperature gradient obtained from a result of directly or indirectly measuring a temperature of the peltier element.

When an object to be cooled/heated by the peltier module 300 is, for example, an IC device 2 to be tested shown in FIG. 5, examples of the control signal to be input to the current change rate generation circuit C3 are (1) a control signal being converted so that a temperature of the IC device 2 becomes constant, which is obtained by detecting a package temperature of the IC device 2 by a temperature sensor and using the detected temperature signal; (2) a control signal being converted so that a temperature of the IC device 2 becomes constant, which is obtained by measuring a forward voltage characteristic at both ends of a diode exclusive for temperature detection provided inside the IC chip for directly detecting a junction temperature of the IC device 2 and using the measured voltage characteristic; and (3) a control signal being converted so that a temperature of the IC device 2 becomes constant, which is obtained by using a diode provided as protection to an input/output terminal of the IC chip as a diode for detecting a temperature and using a voltage characteristic measured by using the diode; etc.

In the above example, a temperature sensor for detecting a package temperature of the IC device 2 may be configured to be provided for each of a plurality of IC devices 2 or configured for detecting package temperatures of a plurality of IC devices 2 by using only one temperature sensor as a representative.

The reference voltage conversion circuit C4 is a circuit for outputting as a new reference voltage signal a result of adding a voltage based on the change rate signal input from the current change rate generation circuit C3 and a reference voltage immediately before that. The reference voltage signal is output to the "−" side of the voltage comparator C5.

The voltage comparator C5 is a circuit for comparing a sawtooth wave signal input from the sawtooth wave generation circuit C2 with the reference voltage signal input from the reference voltage conversion circuit C4 and, based on the result, outputting a binary switch signal indicating a high level or a low level.

The switch signal output from the voltage comparator C5 is expressed, for example, by a pulse width ($W_0$, $W_1$, $W_2$, $W_3$, $W_4$, ... $W_s$) in the graph in FIG. 2. In the switch signal, a duty ratio of the pulse width gradually increases under a constant frequency. Note that, to simplify an explanation, the switch signal is indicated by six little pulses in FIG. 2, however, it is composed of a large number of pulses in actually. A shift of a pulse width in FIG. 2 is an example of increasing an applied power to the peltier element, wherein a temperature T of the peltier element changes along with a polygonal line to gradually become higher along with an increase of the applied power.

The switch signal output from the voltage comparator CS in a waveform shown in the graph in FIG. 2 is input to a base electrode of the transistor switch C6, and a collector current controlled to be turned on/off thereby is supplied to the peltier module 300.

By limiting the maximum current change rate and suppressing a thermal stress imposed to the peltier element as explained above, it is possible to suppress abrupt changes of a rate of expansion and rate of shrinkage of respective parts of the peltier element. Consequently, a mechanical stress imposed on the peltier element can be reduced and a long lifetime of the peltier element can be maintained.

As explained above, according to the drive circuit of the peltier element of the present embodiment, a lifetime of the peltier element can be maintained long. Also, the drive circuit of the peltier element according to the present embodiment does not require an expensive variable power source and may be composed of an inexpensive direct-current power source and a general circuit, etc. available on the market.

The embodiment explained above is described to facilitate understanding of the present invention and not to limit the present invention. Accordingly, respective elements disclosed in the above embodiment include all modifications in designs and equivalents belonging to the technical scope of the present invention.

For example, the transistor switch C6 may be composed of an H-bridge circuit to reverse a current direction in the peltier element. In that case, both of cooling and heating may be performed by one surface of the peltier element. Also, an FET (field effect transistor), IPM (intelligent power module) or other power switching circuit may be used instead of the transistor switch C6.

Also, the configurations of the current change rate generation circuit C3 and the reference voltage conversion circuit C4 can be changed to the configurations of a control CPU and a DA converter. Namely, the control CPU receives a control signal from the outside to generate DA data based on the same change rate signal as explained above, adds the DA data and another DA data output to the DA converter immediately before that and outputs the result as new DA data to the DA converter, consequently, the same reference voltage signal as explained above can be generated in the DA converter to which the DA data is input.

Furthermore, in functional operations of the PWM cycle generation circuit C1, the sawtooth wave generation circuit C2, the current change rate generation circuit C3, the reference voltage conversion circuit C4 and the voltage comparator C5, a circuit part able to be processed by software may be replaced by a control CPU or a DSP (digital signal processor) for processing software.

[Pusher and Electronic Device Handling Apparatus]

FIG. 3 is an overall side view of an IC device testing apparatus including an electronic device handling apparatus (hereinafter, referred to as a "handler") according to an embodiment of the present invention, FIG. 4 is a perspective view of a handler according to the same embodiment, FIG. 5 is a sectional view of a key part inside a test chamber of the handler according to the same embodiment, FIG. 6 is a disassembled perspective view showing the configuration near a socket in the handler according to the same embodiment, and FIG. 7 is a side view of a pusher according to an embodiment of the present invention.

First, an overall configuration of the IC device testing apparatus provided with a handler according to an embodiment of the present invention will be explained. As shown in FIG. 3, the IC device testing apparatus 10 comprises a handler 1, a test head 5 and a main testing device 6. The handler 1 performs an operation of successively conveying IC devices (an example of electronic devices) to be tested to sockets provided to the test head 5, classifying IC devices finished with a test based on the test results and storing on predetermined trays.

The sockets provided to the test head 5 are electrically connected to the main testing device through a cable 7, so that IC devices detachably attached to the sockets are connected to the main testing device 6 through the cable 7 and tested by a testing electric signal from the main testing device 6.

At a lower part of the handler 1, a control device for mainly controlling the handler 1 is built in, but a part thereof is provided with a space 8. The test head 5 is arranged in the space 8 in a changeable way, and IC devices can be attached to the sockets on the test head 5 via through holes formed on the handler 1.

The handler 1 is an apparatus for testing IC devices as electronic devices to be tested in a higher temperature state (at a high temperature) and a lower temperature state (at a low temperature) than a normal temperature, and the handler 1 has a chamber 100 composed of a soak chamber 101, a test chamber 102 and an unsoak chamber 103 as shown in FIG. 4. The upper part of the test head 5 shown in FIG. 3 is inserted to inside the test chamber 102 as shown in FIG. 5, where the IC devices 2 are tested.

As shown in FIG. 4, the handler 1 of the present embodiment comprises an IC magazine 200 for holding pre-test IC devices and classifying and holding post-test IC devices, a loader section 300 for transferring IC devices to be tested sent from the IC magazine 200 to the chamber 100, a chamber 100 including the test head and an unloader section 400 for taking out and classifying post-test IC devices tested in the chamber 100. The IC devices are held on a test tray to be conveyed in the handler 1.

A large number of IC devices are held on a customer tray (not shown in the figures) before being set in the handler 1, supplied in that state to the IC magazine 200 of the handler 1 shown in FIG. 4, where the IC devices 2 are reloaded from the customer tray to the test tray TST to be conveyed in the handler 1. Inside the handler 1, as shown in FIG. 5, the IC devices are moved in a state of being loaded on the test tray TST, given a thermal stress of a high temperature or a low temperature, tested (inspected) whether or not they operate appropriately and classified in accordance with the test results. Below, inside of the handler 1 will be explained individually in detail.

First, a part relating to the IC magazine 200 will be explained.

As shown in FIG. 4, the IC magazine 200 is provided with a pre-test IC stocker 201 for holding IC devices before tested and a post-test IC stocker 202 for holding IC devices classified in accordance with the test results.

These pre-test IC stocker 201 and post-test IC stocker 202 comprise a frame-shaped tray support frame 203 and an elevator 204 able to enter from under the tray support frame 203 and move up toward the top and down. The tray support frame 203 supports in it a plurality of stacked customer trays, and only the stacked customer trays are moved up and down by the elevator 204.

The pre-test IC stocker 201 shown in FIG. 4 holds stacked customer trays on which the IC devices to be tested are held, while the post-test IC stocker 202 holds stacked customer trays on which IC devices finished being tested are classified.

Secondary, a part relating to the loader section 300 will be explained.

The customer tray held in the pre-test IC stocker 201 is, as shown in FIG. 4, conveyed by a tray transfer arm 205 provided between the IC magazine 200 and an apparatus substrate 105 from below the apparatus substrate 105 to a window 306 of the loader section 300. Then, in the loader section 300, IC devices loaded on the customer tray are once transferred to a preciser 305 by an X-Y conveyor 304 to correct mutual positions of the IC devices to be tested, then, the IC devices transferred to the preciser 305 are again loaded on the test tray TST stopped in the loader section 300 by using the X-Y conveyor 304.

The X-Y conveyor 304 for reloading IC devices to be tested from a customer tray to a test tray TST comprises, as shown in FIG. 4, two rails 301 laid over an apparatus substrate 105, a movable arm 302 capable of moving back and forth (this direction is designated as the Y-direction) between the test tray TST and the customer tray by those two rails 301, and a movable head 303 supported by the movable arm 302 and capable of moving in the X-direction along the movable arm 302.

The movable head 303 of the X-Y conveyor 304 has suction heads attached facing downward. The suction heads move while drawing air to pick up the IC devices to be tested from the customer tray and reload the IC devices to be tested on the test tray TST.

Thirdly, a part relating to the chamber 100 will be explained.

The above test tray TST is loaded with IC devices to be tested at the loader section 300, then sent to the chamber 100, where the respective IC devices are tested in the state of being loaded on the test tray TST.

As shown in FIG. 4, the chamber 100 comprises a soak chamber 101 for giving a thermal stress of an objected high temperature or a low temperature to the IC devices to be tested loaded on the test tray TST, a test chamber 102 wherein the IC devices in a state of being given a thermal stress in the soak chamber 101 are mounted on sockets on the test head 5, and an unsoak chamber 103 for removing the given thermal stress from the IC devices tested in the test chamber 102.

In the unsoak chamber 103, the IC devices are brought back to the room temperature by ventilation when a high temperature was applied in the soak chamber 101, and brought back to a temperature of a degree of not causing condensation by heating by a hot air or a heater, etc. when a low temperature was applied in the soak chamber 101. Then, the IC devices brought to a normal temperature are taken out to the unloader section 400.

As shown in FIG. 5, a test head 5 is arranged at a lower portion in the test chamber 102 and the test tray TST is transferred to be on the test head 5. Note that the test tray TST is provided with inserts 16 (refer to FIG. 6) holding IC devices 2. There, all IC devices 2 held by the test tray TST are successively brought to electrically contact with the test head 5, and all IC devices 2 on the test tray TST are tested. On the other hand, the test tray TST finished the test is removed a thermal stress in the unsoak chamber 103 so as to bring the temperature of the IC devices 2 to the room temperature, then, taken out to the unloader section 400 shown in FIG. 4.

Also, as shown in FIG. 4, at an upper portion of the soak chamber 101 and the unsoak chamber 103 is formed an inlet opening for taking in the test tray TST from the apparatus substrate 105 and an outlet opening for taking out the test tray TST to the apparatus substrate 105, respectively. The apparatus substrate 105 is attached with test tray conveyors 108 for taking in and out the test tray TST to and from the openings. The conveyor 108 comprises, for example, a rotation roller, etc. The test tray TST taken out from the unsoak chamber 103 is conveyed to the unloader section 400 by the test tray conveyor 108 provided on the apparatus substrate 105.

In the insert 16 of the present embodiment, a rectangular recessed IC container 19 for containing an IC device 2 to be tested as shown in FIG. 6 is formed at its center portion. On the center portion of both ends of the insert 16 are formed guide holes 20 to which later explained guide pins 35 of a pusher 30 are inserted, and at corners on both ends of the insert 16 are formed mounting holes 21 for mounting tubs of a test tray TST.

As shown in FIG. 6, a socket board 50 is arranged on the test head 5 and, on top thereof, a socket 40 having probe pins 44 as connection terminals is fixed. The probe pins 44 are provided by the number and pitches corresponding to those of connection terminals of an IC device 2 and biased in the upward direction by a spring (not shown in the figures).

Also, as shown in FIG. 6, on the socket board 50, a socket guide 41 is fixed so that probe pins 44 provided to the socket 40 are exposed. On both sides of the socket guide 41, guide bushes 411 for being inserted two guide pins 35 formed on the pusher 30 are formed for aligning with the two guide pins 35. Also, four stopper portions 412 for regulating a lower limit of the pusher 30 are formed on the socket guide 41.

As shown in FIG. 5, on an upper side of the test head 5, pushers 30 are provided by the number corresponding to the number of sockets 40. A pusher 30 according to the present embodiment has a pusher base 31 fixed to later explained rods 621 of an adopter 62 as shown in FIG. 7. At the center on the lower side of the pusher base 31, pressing tabs 32 for pressing an IC device 2 to be tested are provided facing downward, and at both end portions on the lower side of the pusher base 31, guide pins 33 to be inserted to guide holes 20 on the insert 16 and the guide bushes 411 of the socket guide 41 are provided. Also, between the pressing tabs 32 and the guide pins 33, a stopper pin 34 is provided for regulating a lower limit by contacting a stopper surface 412 of the socket guide 41 when the pusher 30 moves downward by a Z-axis drive device 70.

On the other hand, on the upper side of the pusher base 31, a peltier module 300 is provided via silicone grease G. The peltier module 300 comprises a first substrate 301*a* positioned on the pusher base 31 side, a second substrate 301*b* facing to the first substrate 301*a*, a P-type thermoelectric element 303*a* and an N-type thermoelectric element 303*b* (the pair of thermoelectric elements are collectively referred to as a peltier element) sandwiched between the substrates 301*a* and 301*b* and an electrode 302 for connecting the P-type thermoelectric element 303*a* and the N-type thermoelectric element 303*b* next to each other electrically in series.

The peltier module 300 is attached to the pusher 30 as a result that engagement members 311 to be engaged with end portions of the first substrate 301*a* are fixed to the pusher base 31 of the pusher 30 by bolts 312 penetrating the engagement members 311.

On the upper side of the second substrate 301*b* of the peltier module 300, a cover member 321 covering an upper surface of the second substrate 301*b* is provided, and a supply tube 322 for supplying a temperature adjusting medium to inside the cover member 321 is connected to the cover member 321. The supply tube 322 is preferably formed by a sufficiently flexible material so as not to give an excessive pressure to the peltier module 300. As such a supply tube 322, for example, a flexible tube and an accordion-structured tube may be used.

In the peltier module 300 attached to the pusher 30 as explained above, a pressure applied to the peltier elements 303*a* and 303*b* is a degree of what applied by weights of the second substrate 301*b* and the cover member 321. Accordingly, since an excessive pressure is not constantly applied to the peltier elements 303*a* and 303*b*, a thermal stress due to cooling and heating imposed on the peltier elements 303*a* and 303*b* is a little. Also, even when the first substrate 301*a* or the second substrate 301*b* expands by being heated, the second substrate 301*b* can move upward so that almost no stress is generated on the peltier elements 303*a* and 303*b*. As explained above, a mechanical stress imposed on the peltier elements 303*a* and 303*b* is small and a lifetime of the peltier elements 303*a* and 303*b* can be long.

In the present embodiment, when a direct current in a predetermined direction is supplied to the peltier module 300, heat is absorbed on the first substrate 301*a* side and the heat is released on the second substrate 301*b* side. Accordingly, by supplying the current to the peltier module 300 during a test, the pusher 30 can be cooled on the first substrate 301a side of the peltier module 300. Also, the second substrate 301b of the peltier module 300 can be cooled by a cooling medium to be supplied inside the cover member 321, so that heat on the first substrate 301a in the peltier module 300 can be discharged to the outside.

Also, when a direct current in an inverse direction from the above is supplied to the peltier module 300, heat is absorbed on the second substrate 301b side and the heat is released on the first substrate 301a side. Accordingly, by supplying the current to the peltier module 300 during a test, the pusher 30 can be heated on the first substrate 301a side of the peltier module 300 and it is possible to obtain an advantage that a temperature control range of the pressing tabs 32 of the pusher 30 can become wide.

Note that a power to be supplied to the peltier module 300 is preferably supplied by using the drive circuit of the peltier element explained above, consequently, the peltier element can be used for a long lifetime.

As shown in FIG. 7, the adopter 62 is provided with (two) rods 621 facing downward, and the rods 621 support and fix the pusher base 31 of the pusher 30. As shown in FIG. 5, each adopter 62 is held elastically by a match plate 60, the match plate 60 is supported to position above the test head 5 by a drive plate 72 so that a test tray TST can be inserted between the pusher 30 and the socket 40. The pusher 30 held by such a match plate 60 is freely movable in the test head 5 direction and the drive plate 72 direction, that is, the Z-axis direction.

Note that the test tray TST is conveyed between the pusher 30 and the socket 40 from the vertical direction to the paper in FIG. 5 (X-axis direction). As a conveyor means of the test tray TST inside the chamber 100, a conveyor roller, etc. is used. When conveying and moving the test tray TST, the drive plate of the Z-axis drive device 70 is elevated along the Z-axis direction and a sufficient space is formed for the test tray TST to be inserted between the pusher 30 and the socket 40.

As shown in FIG. 5, a pressing portion 74 is fixed on the lower surface of the drive plate 72 so as to be able to press an upper surface of the adopter 62 held by the match plate 60. A drive axis 78 is fixed to the drive plate 72 and the drive axis 78 is connected to a motor or other drive source (not shown), therefore, the drive axis 78 can be moved up and down along the Z-axis direction so as to be able to press the adopter 62.

Note that the match plate 60 is configured to be changeable with the adopter 62 and the pusher 30 in accordance with a shape of an IC device 2 to be tested and the number of sockets (the number of IC devices 2 to be measured at a time) of the test head 5, etc. By making the match plate 60 changeable as such, the Z-axis drive device 70 can be used widely.

In the present embodiment, in the chamber 100 configured as explained above, as shown in FIG. 5, a temperature adjusting ventilator 90 is installed inside a tightly sealed casing 80 composing the test chamber 102. The temperature adjusting ventilator 90 comprises a fan 92 and a heat exchanger 94 and brings inside the casing 80 to be under a predetermined temperature condition (a high temperature or a low temperature) by drawing in an air inside the casing by the fan 92, letting it through the heat exchanger 94 and blowing to inside the casing 80 for circulation.

Fourthly, a part relating to the unloader section 400 will be explained.

The unloader section 400 shown in FIG. 4 is also provided with X-Y conveyors 404 and 404 each having the same configuration as that of the X-Y conveyor 304 provided to the loader section 300. Post-test IC devices are reloaded from the test tray TST conveyed out to the unloader section 400 to a customer tray by the X-Y conveyors 404 and 404.

As shown in FIG. 4, an apparatus substrate 105 of the unloader section 400 is provided with two pairs of windows 406 and 406 arranged so that the customer trays conveyed to the unloader section 400 can be brought close from below to the upper surface of the apparatus substrate 105.

Below each of the windows 406 is provided with an elevator 204 for elevating and lowering the customer tray, in which a customer tray becoming full after being reloaded with the post-test IC devices is placed and lowered, and the full tray is given to the tray transfer arm 205.

Next, a method of testing an IC device 2 while controlling a temperature of the IC device 2 via the pusher 30 in the IC device testing apparatus 10 explained above will be explained.

IC devices 2 in a state of being loaded on the test tray TST, more specifically, being dropped to be held in the IC containers 19 of the inserts 16 shown in FIG. 6 are conveyed to inside the test chamber 102 after heated to a predetermined temperature in the soak chamber 101.

When a test tray TST loaded with IC devices 2 stops above the test head 5, the Z-axis drive device operates and pressing portion 74 fixed to the drive plate 72 presses the pusher base 33 of the pusher 30 via the rods 621 of the adopter 62. Consequently, the pressing tabs 31 of the pusher 30 press package bodies of the IC devices 2 against the socket 40 side, as a result, connection terminals of the IC devices 2 are connected to the probe pins 44 of the socket 40.

In this state, a test is conducted by sending a test electric signal from the main testing device 6 to the IC devices 2 to be tested via the probe pins 44 of the test head 5. When a temperature of the IC devices 2 to be tested becomes higher than a predetermined set temperature due to self heating, a power is supplied to the peltier module 300 and a cooling medium is supplied into the cover member 321 so that the pusher 30 can be cooled. The IC devices 2 to be tested are cooled by the peltier module 300, which is cooled by the cooling medium and exhibits a higher cooling effect, via the pusher 30, so that an excessive temperature rise of the IC devices 2 to be tested can be prevented.

Also, when heat inside the test chamber 102 is released from the socket 40 and a temperature of the IC devices 2 to be tested becomes lower than a predetermined set temperature, a direction of a current is changed to heat the pusher 30 and a power is supplied to the peltier module 300, so that the IC devices 2 can be heated. In this way, a temperature decline of the IC devices 2 can be prevented.

According to the handler 1 according to the present embodiment, a test can be accurately conducted while controlling IC devices 2 to be tested to be near the set temperature as explained above.

When a test of the IC devices 2 finishes, the X-Y conveyor 404 stores the post-test IC devices 2 on the customer trays in accordance with the test results.

The embodiments explained above are described to facilitate understanding of the present invention and not to limit the present invention. Accordingly, respective elements disclosed in the above embodiments include all modifications in designs and equivalents belonging to the technical scope of the present invention. For example, the configuration of attaching the peltier module 300 to the pusher 30 and an external temperature control means of the peltier module 300 may be modified as below.

FIG. 8 is a side view of a pusher according to another embodiment of the present invention. As shown in FIG. 8, a peltier module 300 is provided via silicone grease G on an upper side of the pusher base 31 in the pusher 30 according to the present embodiment. The configuration of the peltier module 300 is as explained above.

On the upper side of the peltier module 300, an air jacket 330 is provided via silicone grease G. A cooling air or a heating air can circulate inside the air jacket 330.

The air jacket 330 is attached to the pusher 30 while being biased to the peltier module 300 side by a fixing member 340. Namely, the fixing member 340 comprises engagement members 341 to be engaged with end portions of an upper surface of the air jacket 330, bolts 343 for penetrating the engagement members 341 and springs 344 each positioned between a head portion 342 of each of the bolts 343 and each of the engagement members 341. As a result that the bolts 343 of the fixing members 340 are fixed to the pusher base 31 of the pusher 30, the air jacket 330 is attached to the pusher 30 in a state of maintaining a constant pressing force against the pusher 30 side by the springs 344.

In the peltier module 300 attached to the pusher 30 as explained above, a pressure applied to the peltier elements is a degree of what applied by weights of the second substrate 301b and the air jacket 330 and a biasing force by the springs 344. Therefore, an excessive pressure is not constantly applied to the peltier elements 303a and 303b, so that a thermal stress caused by cooling and heating is a little on the peltier elements 303a and 303b. Also, even when the first substrate 301a or a second substrate 301b expands by being heated, the air jacket 330 only maintains a constant pressing force against the pusher 30 side by the springs 344, so that an excessive mechanical stress is not imposed on the peltier elements 303a and 303b. In this way, a lifetime of the peltier elements 303a and 303b can become long.

Note that, in the above embodiment, an air jacket 330 was taken as an example of an external temperature control means of the peltier module 300, but the present invention is not limited to that and a water jacket or a heat sink may be also applied.

INDUSTRIAL APPLICABILITY

The present invention is extremely useful to maintain a lifetime of a peltier element long.

EXPLANATION OF REFERENCES

Figure 1:
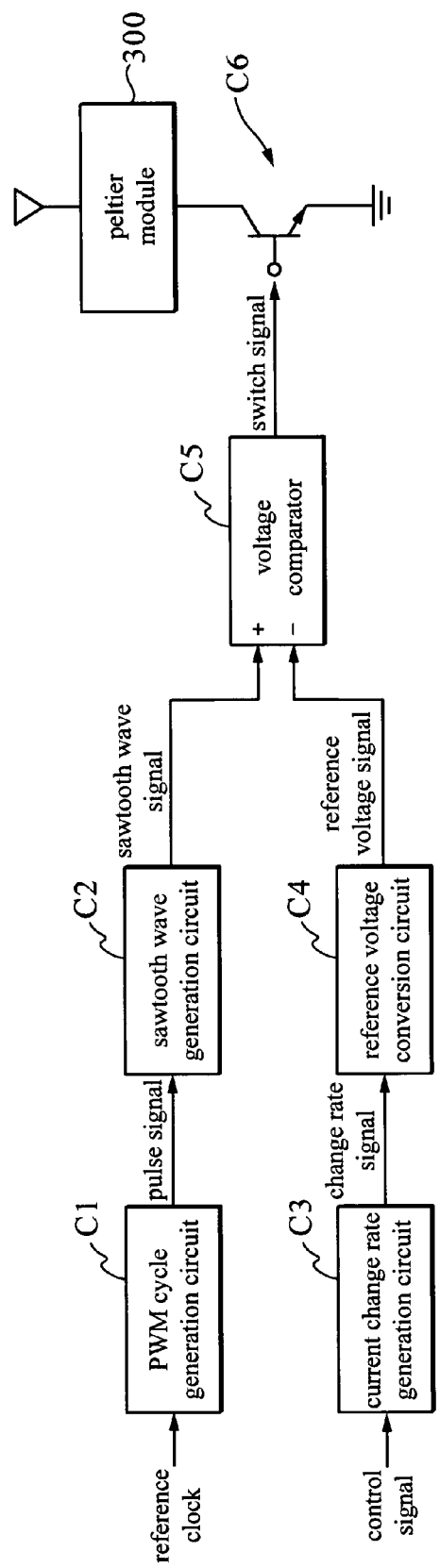
FIG. 1 is a view of the configuration of a drive circuit of a peltier element according to an embodiment of the present invention.
Figure 2:
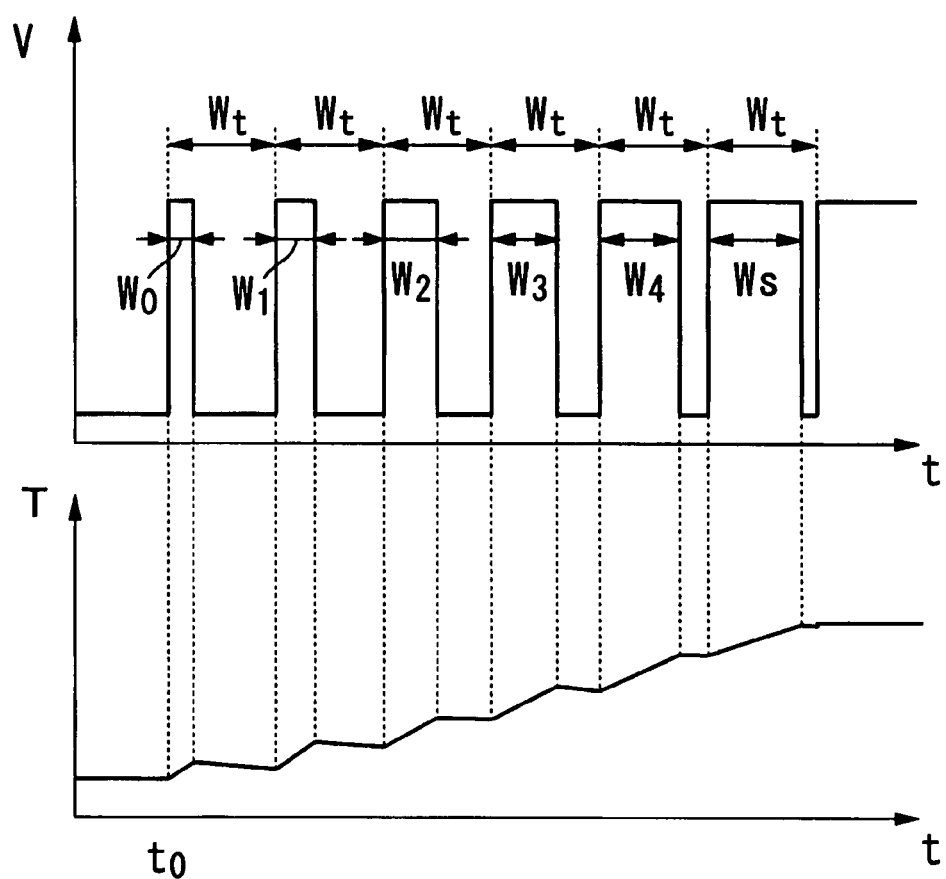
FIG. 2 is a graph showing a temperature change of a peltier element with respect to a pulse voltage to be supplied to the peltier element by the drive circuit of the peltier element according to the same embodiment.
Figure 3:
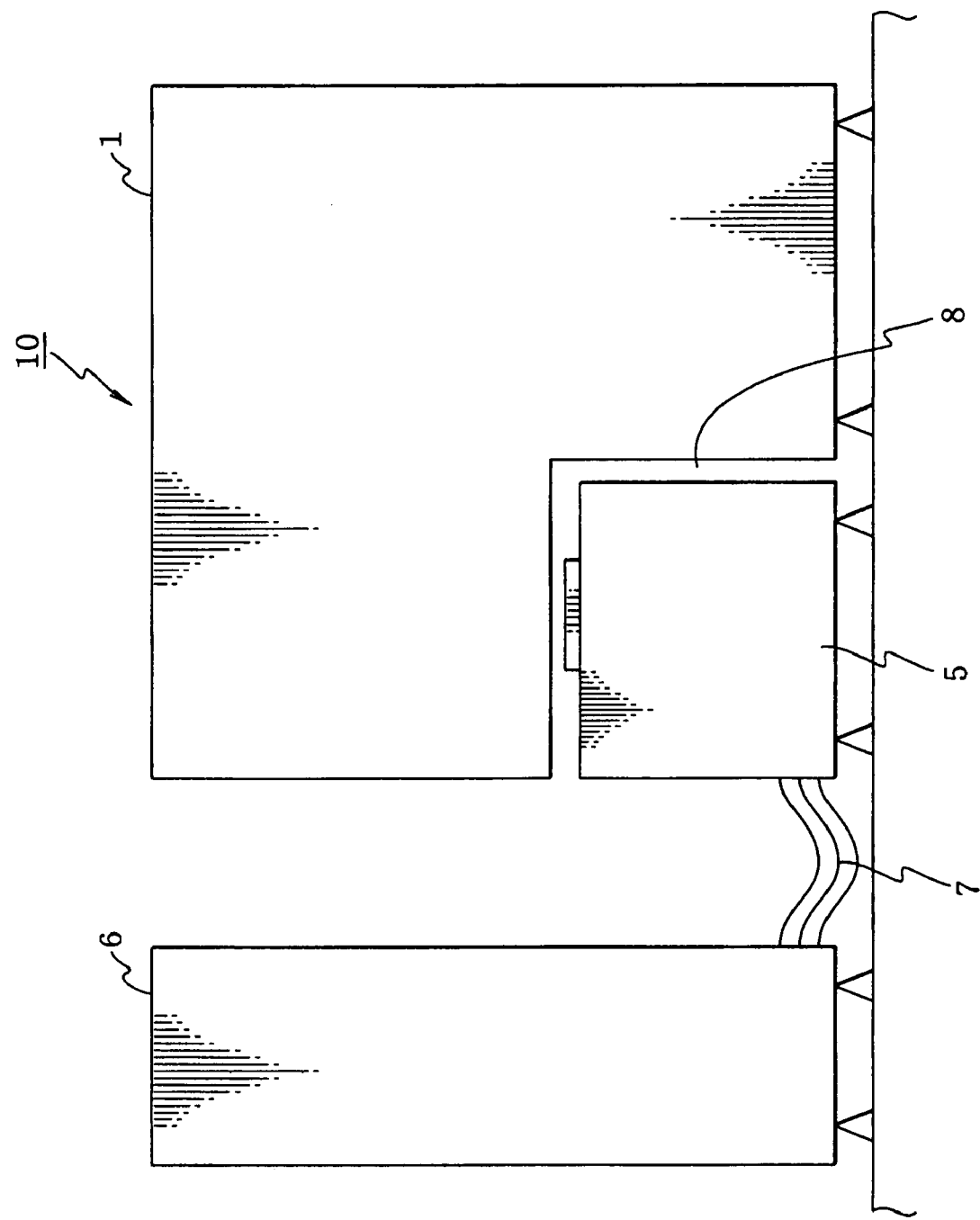
FIG. 3 is an overall side view of an IC device testing apparatus including a handler according to an embodiment of the present invention.
Figure 4:
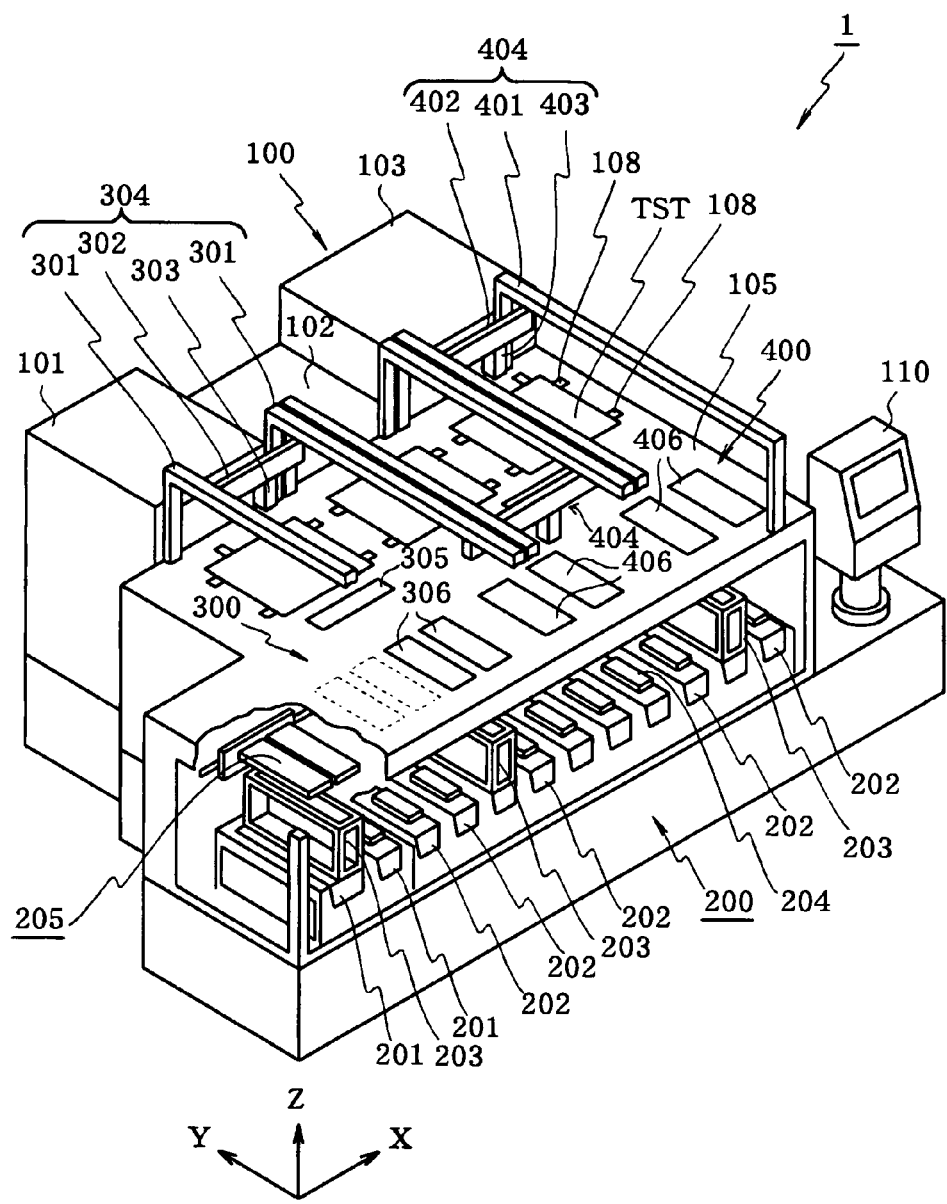
FIG. 4 is a perspective view of the handler according to the same embodiment.
Figure 5:
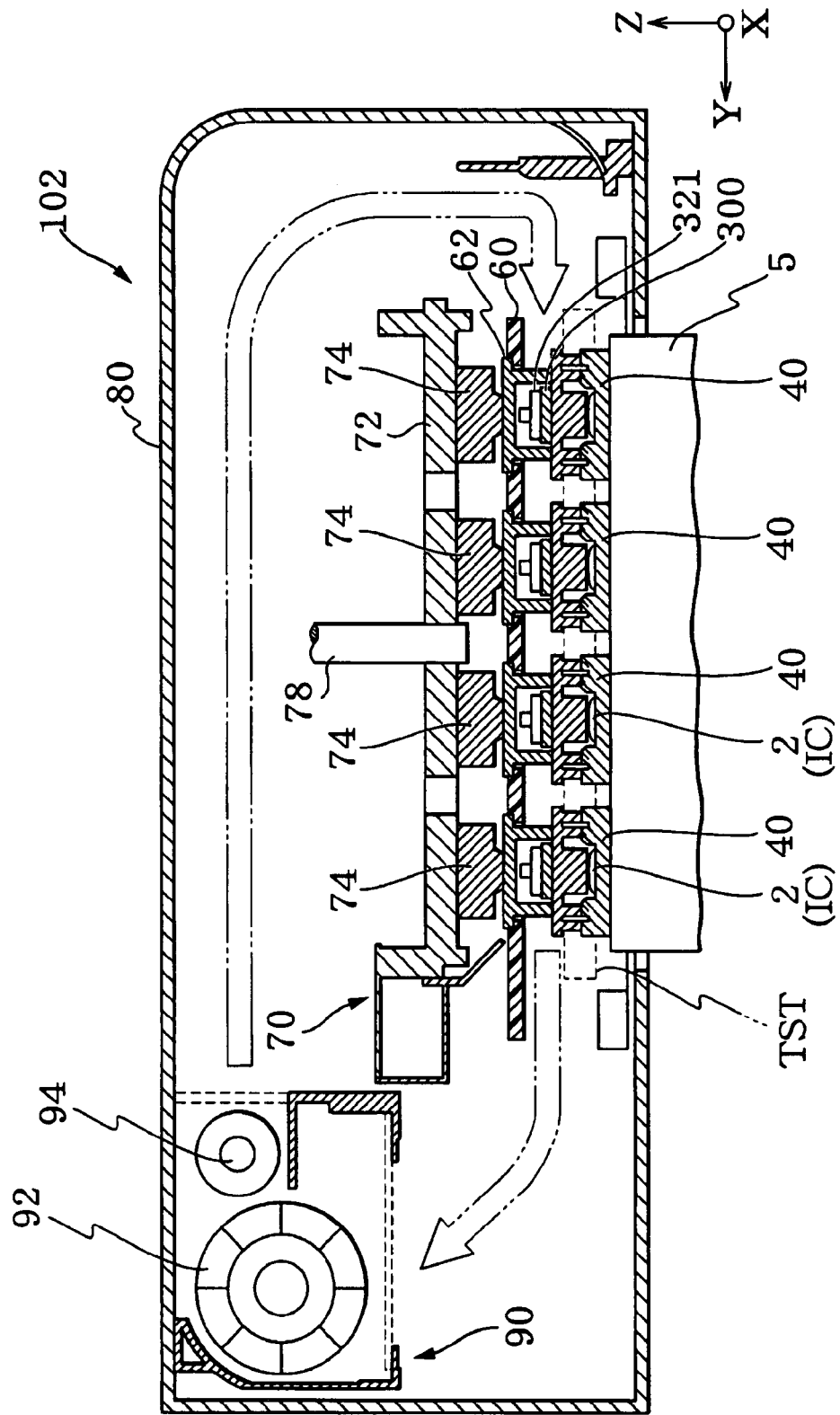
FIG. 5 is a sectional view of a key part inside a test chamber of the handler according to the same embodiment.
Figure 6:
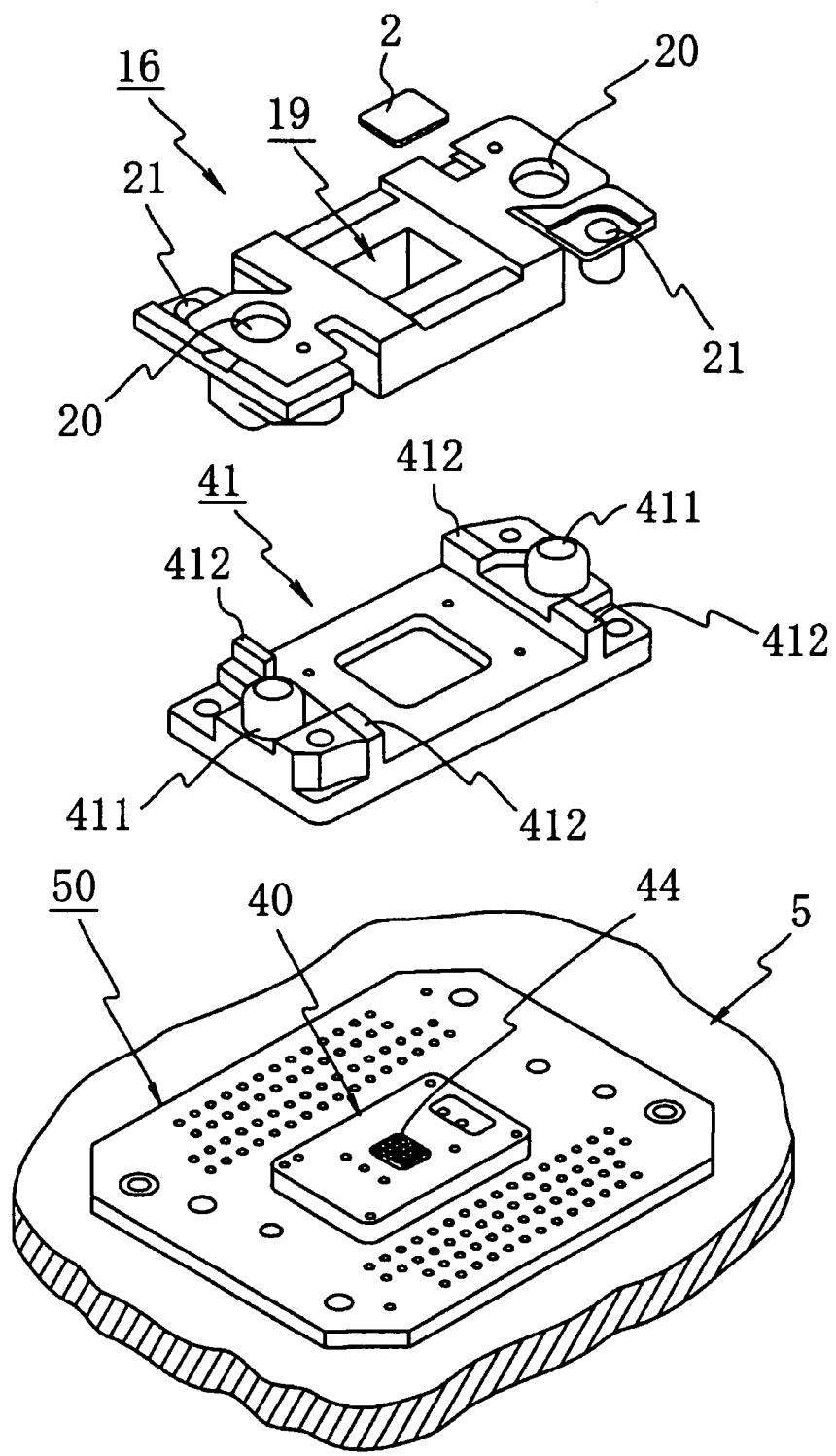
FIG. 6 is a disassembled perspective view showing the configuration near a socket in the handler according to the same embodiment.
Figure 7:
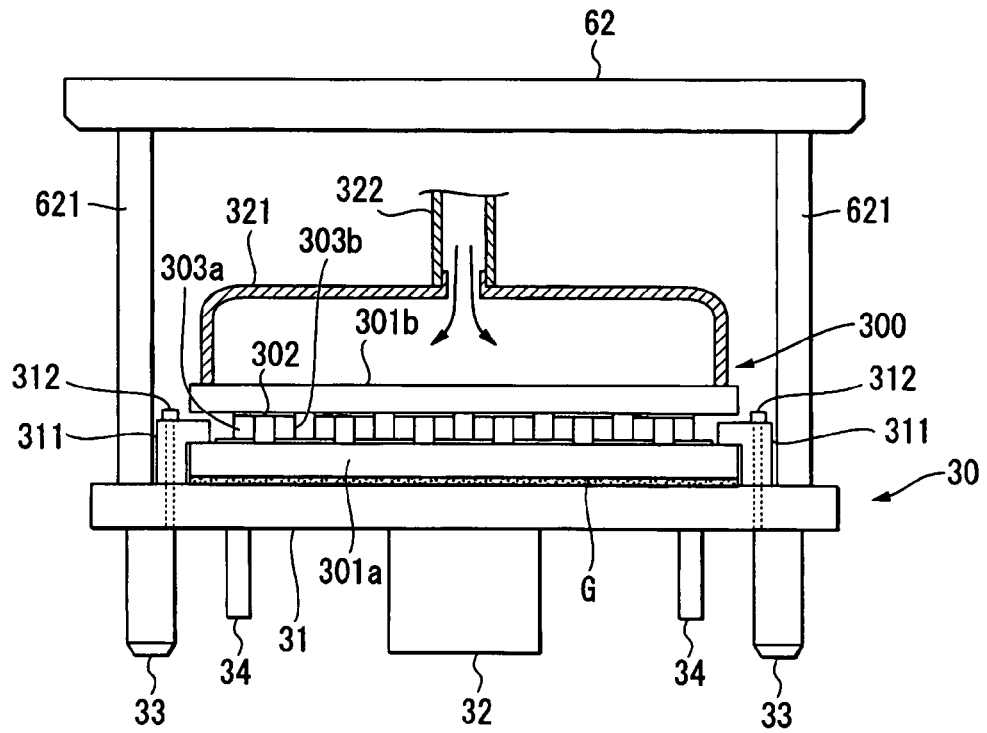
FIG. 7 is a side view of a pusher according to an embodiment of the present invention.
Figure 8:
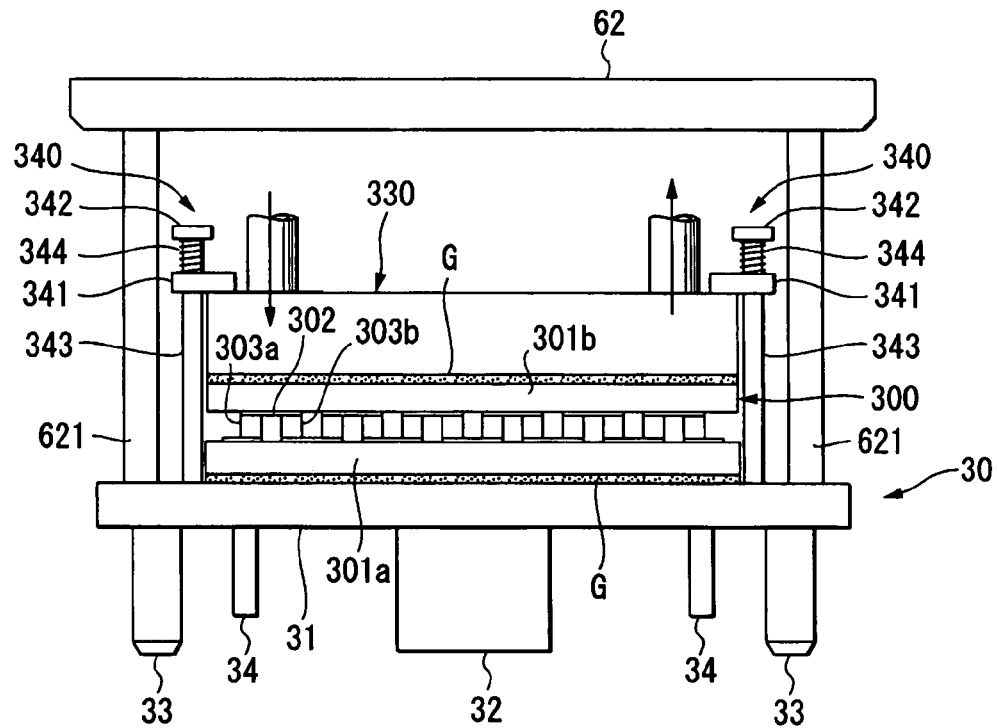
FIG. 8 is a side view of a pusher according to another embodiment of the present invention.

1 . . . electronic device handling apparatus (handler)
10 . . . IC device (electronic device) testing apparatus
30 . . . pusher
300 . . . peltier module
  301a, 301b . . . substrate
  303a . . . P-type thermoelectric element
  303b . . . N-type thermoelectric element

The invention claimed is:

1. An attaching structure of a peltier module for attaching the peltier module to an object to be cooled/heated, wherein
said object to be cooled/heated is a pusher capable of pressing an electronic device to be tested against a contact portion of a test head for conducting a test on the electronic device,
said peltier module is provided on said pusher,
said peltier module comprises a substrate capable of composing a cooling surface and a substrate capable of composing a heat release surface, and said peltier module is attached to said pusher so that said cooling surface position on said pusher at an opposite side of the side of pressing the electronic device to be tested,
an air jacket in which a cooling air or a heating air can circulate is provided on the heat release surface of the peltier module,
the air jacket is attached to the pusher while being biased to the peltier module side by a fixing member which comprises a spring,
the air jacket is attached to the pusher in a state of maintaining a constant pressing force against the pusher side by the spring, and
accordingly, the peltier module is attached to the pusher so than an excessive pressure is not constantly applied to the peltier module.

2. The attaching structure of a peltier module as set forth in claim 1, wherein said pusher is movable in a direction of pressing the electronic device to be tested against the contact portion of the test head and a direction of separating from the contact portion of the test head.

3. The attaching structure of a peltier module as set forth in claim 1, wherein said pusher is provided with guide pins for guiding the pusher to align with socket guides provided to the contact portion of the test head.

4. The attaching structure of a peltier module as set forth in claim 1,
wherein the fixing member comprises a plurality of engagement members to be engaged with end portions of an upper surface of the air jacket, bolts for penetrating the plurality of engagement members and the springs each positioned between a head portion of each of the bolts and each of the plurality of engagement members, and
the bolts of the fixing members are fixed to the pusher.

5. The attaching structure of a peltier module as set forth in claim 4,
wherein the pusher has a pusher base,
wherein the peltier module is provided on the pusher base, and
wherein the bolts are fixed to the pusher base.

6. The attaching structure of a peltier module as set forth in claim 1, wherein the peltier module is provided on the pusher via silicone grease.

7. The attaching structure of a peltier module as set forth in claim 1, wherein the air jacket is provided on the peltier module via silicon grease.

8. An attaching structure, comprising:

a pusher configured to press an electronic device to be tested against a contact portion of a test head for conducting a test on the electronic device;

a peltier module provided on the pusher, the peltier module including a first substrate configured to operate as a cooling surface and a second substrate configured to operate as a heat release surface; and an air jacket in which a cooling air or a heating air can circulate provided on the heat release surface of the peltier module, wherein the pusher is positioned such that the cooling surface is formed on an opposite side of the pusher from the electronic device to be tested, and wherein the air jacket is attached to the pusher and is biased to a side of the peltier module by a fixing member that comprises a spring.

9. The attaching structure set forth in claim 8, wherein the pusher is movable in a direction of pressing the electronic device to be tested against the contact portion of the test head and in a direction separating the electronic device to be tested from the contact portion from the test head.

* * * * *